United States Patent [19]
Levin

[11] Patent Number: 6,073,339
[45] Date of Patent: Jun. 13, 2000

[54] METHOD OF MAKING LOW PROFILE PIN-LESS PLANAR MAGNETIC DEVICES

[75] Inventor: Gedaly Levin, Acton, Mass.

[73] Assignee: TDK Corporation of America, Mt. Prospect, Ill.

[21] Appl. No.: 09/210,328

[22] Filed: Dec. 11, 1998

Related U.S. Application Data

[62] Division of application No. 08/865,456, May 29, 1997.
[60] Provisional application No. 60/025,283, Sep. 20, 1996.
[51] Int. Cl.[7] ........................................................ H01F 41/04
[52] U.S. Cl. ............................ 29/606; 29/602.1; 336/200
[58] Field of Search ................................. 29/602.1, 606; 336/200, 192, 232

[56] References Cited

U.S. PATENT DOCUMENTS

| | | |
|---|---|---|
| 3,483,499 | 12/1969 | Lugten . |
| 3,798,059 | 3/1974 | Astle et al. . |
| 4,075,591 | 2/1978 | Haas . |
| 4,310,821 | 1/1982 | Frances . |
| 4,313,151 | 1/1982 | Vranken . |
| 4,313,152 | 1/1982 | Vranken . |
| 4,322,698 | 3/1982 | Takahashi et al. . |
| 4,494,100 | 1/1985 | Stengel et al. . |
| 4,543,553 | 9/1985 | Mandai et al. . |
| 4,545,553 | 10/1985 | Finke et al. . |
| 4,613,843 | 9/1986 | Esper et al. . |
| 4,622,627 | 11/1986 | Rodriguez et al. . |
| 4,626,816 | 12/1986 | Blumkin et al. . |
| 4,635,354 | 1/1987 | Chrobak et al. . |
| 4,641,114 | 2/1987 | Person . |

(List continued on next page.)

FOREIGN PATENT DOCUMENTS

| | | |
|---|---|---|
| 0 267 108 | 5/1988 | European Pat. Off. . |
| 58-21806 | 2/1983 | Japan . |
| 58-67007 | 4/1983 | Japan . |
| 58-140104 | 8/1983 | Japan . |
| 59-58805 | 4/1984 | Japan . |
| 59-58806 | 4/1984 | Japan . |
| 59-114807 | 7/1984 | Japan . |
| 62-189707 | 8/1987 | Japan . |
| 2-101715 | 4/1990 | Japan . |
| 2-128409 | 5/1990 | Japan . |
| 3-183106 | 8/1991 | Japan . |
| 5-82350 | 4/1993 | Japan . |
| 5-135968 | 6/1993 | Japan . |
| 5-205943 | 8/1993 | Japan . |
| 5-258973 | 10/1993 | Japan . |
| 5-315152 | 11/1993 | Japan . |
| 6-36936 | 2/1994 | Japan . |
| 6-69038 | 3/1994 | Japan . |
| 1116161 | 6/1968 | United Kingdom . |

*Primary Examiner*—Carl E. Hall
*Attorney, Agent, or Firm*—Darby & Darby

[57] ABSTRACT

A method for making a planar magnetic device is presented. The magnetic device has generally spirally-directed planar coils supported on plural substrates. The plural substrates are stacked so as to have their respective outer peripheries connected to termination pads which are laterally spaced from the termination pads of other coils, as viewed in a direction perpendicular to the planar coils. The inner termini of at least two of the coils may be interconnected by a plated via to constitute a single winding on plural planes. An exposed portion of the termination pads resides alongside vertical edges of the magnetic device and is electrically connected to a vertical plating which form pin-less terminations of the magnetic device. The magnetic device may include a beveled portion for orientation of the device in a circuit. A method of manufacturing the magnetic device is also disclosed.

20 Claims, 8 Drawing Sheets

6,073,339

Page 2

U.S. PATENT DOCUMENTS

| | | |
|---|---|---|
| 4,689,594 | 8/1987 | Kawabata et al. . |
| 4,731,297 | 3/1988 | Takaya . |
| 4,803,453 | 2/1989 | Tomono et al. . |
| 4,803,543 | 2/1989 | Inayoshi et al. . |
| 4,873,757 | 10/1989 | Williams . |
| 4,918,417 | 4/1990 | Sakamoto . |
| 4,926,292 | 5/1990 | Maple . |
| 4,959,631 | 9/1990 | Hasegawa et al. . |
| 5,010,314 | 4/1991 | Estrov . |
| 5,051,712 | 9/1991 | Naito et al. . |
| 5,071,509 | 12/1991 | Kano et al. . |
| 5,179,365 | 1/1993 | Raggi . |
| 5,182,536 | 1/1993 | Boylan et al. . |
| 5,251,108 | 10/1993 | Doshita . |
| 5,300,911 | 4/1994 | Walters . |
| 5,302,932 | 4/1994 | Person et al. . |
| 5,321,380 | 6/1994 | Godek et al. . |
| 5,345,670 | 9/1994 | Pitzele et al. . |
| 5,351,167 | 9/1994 | Wai et al. . |
| 5,353,001 | 10/1994 | Meinel et al. . |
| 5,359,315 | 10/1994 | Inoue et al. . |
| 5,363,080 | 11/1994 | Breen . |
| 5,392,019 | 2/1995 | Ohkubo . |
| 5,398,400 | 3/1995 | Breen . |
| 5,402,098 | 3/1995 | Ohta et al. . |
| 5,430,424 | 7/1995 | Sato et al. . |
| 5,430,613 | 7/1995 | Hastings et al. . |
| 5,463,365 | 10/1995 | Iwatani et al. . |
| 5,487,214 | 1/1996 | Walters . |
| 5,497,137 | 3/1996 | Fujiki . |
| 5,515,022 | 5/1996 | Tashiro et al. . |
| 5,521,573 | 5/1996 | Inoh et al. . |
| 5,532,667 | 7/1996 | Haertling et al. . |

METHOD OF MAKING LOW PROFILE PIN-LESS PLANAR MAGNETIC DEVICES

This is a division of application Ser. No. 08/865,456, filed May 29, 1997. Each of these prior applications is hereby incorporated herein by reference, in its entirety.

This application claims priority under 35 U.S.C. § 119 based upon Provisional Application Ser. No. 60/025,283, filed Sep. 20, 1996.

FIELD OF THE INVENTION

This invention relates to magnetic devices, and, more particularly, to planar magnetic devices having pin-less terminations and a method of making same.

BACKGROUND OF THE INVENTION

Magnetic components, such as inductors and transformers, have posed challenges to the industry due to their structure, which has conventionally included winding wire having a circular cross-section about a bobbin-like core into an often bulky and non-uniform structure which can not be readily handled by vacuum handling devices, as described in U.S. Pat. No. 5,182,536 of Boylan et al.

New operational requirements with respect to circuit size and power density and increasing necessity to reduce circuit manufacturing costs have made the traditional wire-would magnetic component an unattractive element due to its space requirements and the conflicting design criterion of minimizing space requirements of necessary circuit blocks, e.g., power supply circuits. Attaining these conflicting design objectives has required the redesign of magnetic devices to achieve a low profile.

In the recent years, so called "planar magnetics" have been developed and accepted in the industry for high density, high frequency applications, e.g., planar transformers for use in power supplies. Such magnetic devices are generally constituted by a stack of planar copper windings. Planar transformers of such construction have been characterized by desirable electrical and mechanical characteristics such as low weight, high efficiency, and low leakage inductance. The low profile package of such transforms means that the transformer no longer determines the overall height of a power supply.

An example of such a magnetic device is a low-profile planar transformer. Such a transformer typically includes a primary winding formed as a spiral of conductive traces on a planar surface and one or more secondary windings which are formed in the same manner, with the primary and secondary windings being electromagnetically coupled by a core of magnetically permeable material. Such planar transformer designs have enabled control over critical dimensions, and have made the production and assembly of power supply components simple and repeatable; however, the manufacture of planar transformers has been complicated by the need for termination pins to connect the planar coils to external circuitry. In addition, known magnetic devices have not adequately addressed the problem of providing pin-less connections to multiple windings of a single planar magnetic device.

Generally, planar magnetics have used various types of termination pins to physically (e.g., electrically or mechanically) connect the device to an electrical circuit. U.S. Pat. No. 3,833,872 of Marcus et al. is one such example which is hereby incorporated by reference as if set forth in its entirety herein. The '872 patent discloses a monolithic transformer that is formed by laminating a plurality of planar sheets, some of which have conductive spirals and others of which provide insulation. The planar sheets are pre-arranged to result in a laminated transformer of predetermined design with selectively placed conductive vias connecting the stacked layers to one another. The manufacturing method of the '872 patent causes a plurality of transformers to be made simultaneously; the individual transformers being cut from a sintered, laminated structure. Metal terminations are attached to the transformer in a conventional manner as a final step in the process. However, there are several drawbacks associated with the termination of planar devices using pins as in the Marcus et al. process.

For example, the electrical connection between the planar device and a printed circuit board ("PCB") relies on the integrity of an intermediate connection of each to a termination pin, that is, an additional element. The integrity of the electrical connection relies on contact with a plated through hole ("via") of the PCB, and the integrity of the mechanical connection relies upon the mechanical alignment of several vias of the PCB to the termination pins of the magnetic device.

A surface-mount inductive device has been proposed in U.S. Pat. No. 5,363,080 of Breen which is connectable to a PCB without any termination pins. The U.S. Pat. No. 5,363,080 patent is hereby incorporated by reference as if set forth in its entirety herein. The inductor is constructed by successively forming layers upon a single supporting substrate. Purportedly, this method of manufacture provides the designer with highly accurate control over the value of the inductance in the resulting inductor. The method proposed by Breen, however, requires that the inductor be formed in a serial manner, that, is layer by layer, which imposes constraints on the throughput of a manufacturing facility.

The present invention is aimed at overcoming one or more difficulties in the art of manufacturing pin-less, planar magnetic devices.

SUMMARY AND OBJECTS OF THE INVENTION

It is an object of the invention to provide a method of manufacturing a surface-mountable planar magnetic device.

It is yet another object of the invention to provide a method of manufacturing a surface-mountable planar magnetic device comprising a plurality of layers which can be separately formed and later combined into a monolithic assembly.

It is yet a further object of the invention to provide a method of manufacturing a plurality of surface-mountable planar magnetic devices by laminating layers having an arbitrary number of pattern repeats formed thereon.

These and other objects of the invention are achieved by a planar magnetic device in which generally spirally-directed planar coils are supported on plural substrates and are stacked so as to have their respective outer peripheries connected to termination pads, the termination pads being laterally spaced from the termination pads of other coils as viewed in a direction perpendicular to the planar coils. The inner termini of at least two of the coils may be interconnected by a plated via to constitute a single winding on plural planes. An exposed portion of the termination pads resides alongside vertical edges of the magnetic device and is electrically connected to a vertical plating which form pin-less terminations of the magnetic device. The magnetic device may include a bevelled portion for orientation of the device relative to a circuit or a PCB.

These and other objects of the invention are achieved by an inventive method for manufacturing a planar magnetic device in which a plurality of insulative layers are provided, at least some of the layers having a predetermined number of conductive coil turns and a termination pad connected thereto. The layers are stacked, aligned, and laminated into a monolithic structure. Vias are drilled into the monolithic structure, and portions of the monolithic structure are routed to expose the termination pads. The vias are plated along with the exposed termination pads. The plated termination pads comprise the pin-less terminations of the magnetic device. The plural layers may include an arbitrary number of pattern repeats of the coils and termination pads so that a multiplicity of magnetic devices can be simultaneously manufactured by stacking such layers.

A transformer can be manufactured according to the foregoing steps by routing an aperture in the monolithic structure which is sized to receive a magnetically permeable core and by inserting a magnetically permeable core within the aperture.

These and other features and advantages of the invention will be readily apparent from the following detailed description of the invention in conjunction with the drawings therefor.

DETAILED DESCRIPTION OF THE INVENTION

Figure 1:
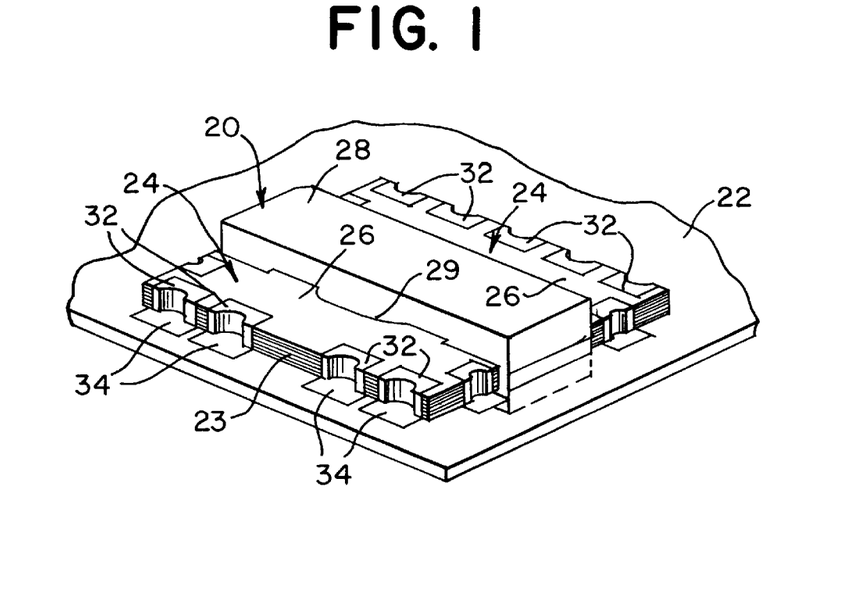
FIG. 1 illustrates a perspective view of a transformer constructed in accordance with the invention.
Figure 2:
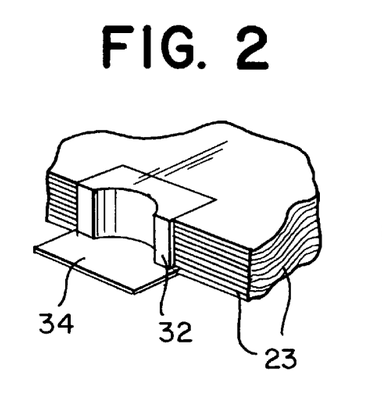
FIG. 2 illustrates an enlarged perspective view of a portion of FIG. 1.

By way of overview and introduction, FIG. 1 illustrates a low profile planar transformer 20 disposed within a printed circuit board ("PCB") 22. The planar transformer 20 is comprised of a stack of substrates 23 each of which may support one or more planar coils 24 to form a layer (L) (see FIGS. 4–9). The substrates 23 are sintered into a monolithic sintered body 26. An aperture 29 is formed in the sintered body 26 which is sized to receive a core 28 of ferromagnetic material. A plurality of platings 32 are conductively connected to the planar coils 24 by way of termination pads 25-x (see FIGS. 4–9), as described in more detail below. The platings 32 are arranged along a vertical margin of the sintered body 26 in accordance with ordinary pin-spacing conventions. As a result, the individual platings 32 will align with contact pads 34 on the PCB 22 upon installation of the transformer 20 into the PCB 22, and, thereby, serve as the terminations of the magnetic device. FIG. 2 shows a detail of the stacked substrates 23 and one of the platings 32. The platings 32 extend in directions which are both parallel and perpendicular to the plane of the planar coils 24.

While the inventive method of manufacture and the resulting magnetic device are described in connection with the manufacture of a pin-less planar transformer of the type shown schematically in FIG. 3 it is to be understood that the method of manufacture could fabricate other transformer winding arrangements, inductive elements, and, more generally, magnetic devices of other design specifications.

Figure 3:
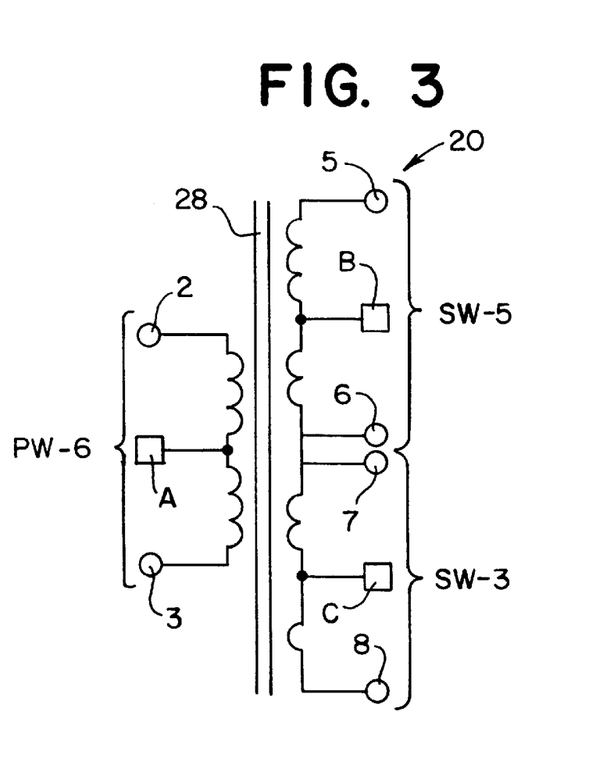
FIG. 3 illustrates a schematic diagram of a conventional transformer.

The schematic transformer shown in FIG. 3 has a six-turn primary winding PW-6 (which extends between terminations 2 and 3) and two secondary windings which comprise a five-turn secondary winding SW-5 (which extends between terminations 5 and 6) and a three-turn secondary winding SW-3 (which extends between terminations 7 and 8). A ferromagnetic core 28 magnetically couples the primary and secondary windings of the transformer 20. More generally, the magnetic device can include a single winding having an arbitrary number of turns, denoted W-n, where "W" refers to a winding and "n" refers to the number of turns.

Conventionally, the six-turn primary winding PW-6 of FIG. 3 would be formed by coiling an insulated wire six times about a magnetic core element. Equivalently, as shown in FIG. 3, the primary winding PW-6 may comprise two serially connected coils having a total of six turns. Each of the serially connected coils has an end connected to a respective one of terminations 2 and 3 and another end commonly connected at node A. Likewise, the secondary windings may comprise two or more serially connecting coils interconnected at nodes B and C, respectively.

In accordance with a salient aspect of the present invention, the primary and secondary windings PW, SW are constituted by planar coils 24 (see FIGS. 4–9) supported on a plurality of substrates 23 which have been oriented to yield a magnetic device according to a predetermined design specification. The design specification may be to provide a transformer with two secondary windings having a turns ratio of, for example, 6:5 and 2:1 as in the schematic diagram of FIG. 3, or to provide a six-turn inductor, etc. Each substrate 23 which supports a coil pattern 24, peripheral pads 25, and via pads 30 is a functional layer (L) of the magnetic device, and each such layer (L) may be formed by photolithographic techniques as described below. The coil 24 supported on a particular substrate 23 will have an outer periphery which is electrically connected to a particular one of the peripheral pads 25, and a generally central terminus which is electrically connected to one of the via pads 30. Each coil 24 is formed in a manner to ensure that it only contacts an intended one of the peripheral pads 25 and via pads 30, and, more typically, to contact only one peripheral pad 25 and one via pad 30. The peripheral pad 25-x to which the outer periphery of the coil 24 makes contact is referred to herein as a "termination pad."

Figure 4:
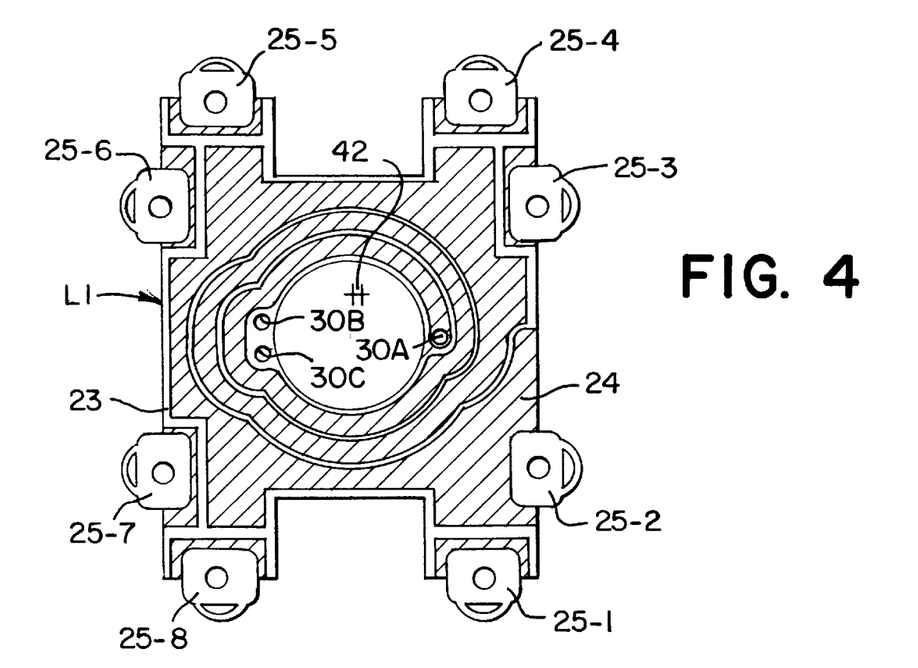
FIG. 4 illustrates a plan view of a first layer of a planar magnetic device according to a preferred embodiment of the invention including a three-turn coil.

With reference now to FIG. 4, a generally radially directed planar coil 24 is shown supported on one surface of the substrate 23. The coil is "radially directed" insofar as a current flowing through the conductive trace of the coil 24 will generally traverse a path that spirals either inwardly or outwardly with a sense, that is, either clockwise or counterclockwise as viewed from above. The coil 24 of FIG. 4 has three turns, and constitutes a first portion of the primary winding PW-6. The outer periphery of the coil 24 is connected to a termination pad 25-2 whereas the central terminus of the coil 24 is connected to via pad 30-A. The substrate 23 of FIG. 4 will be a first layer L1 of a transformer constructed according to the schematic of FIG. 3. Comparing the layer L1 of FIG. 4 to the schematic of FIG. 3, it can be seen that the termination pad 25-2 corresponds to the termination 2, and the three-turn planar coil 24 winds radially inwardly to the via pad 30-A which corresponds to the node A.

Figure 5:
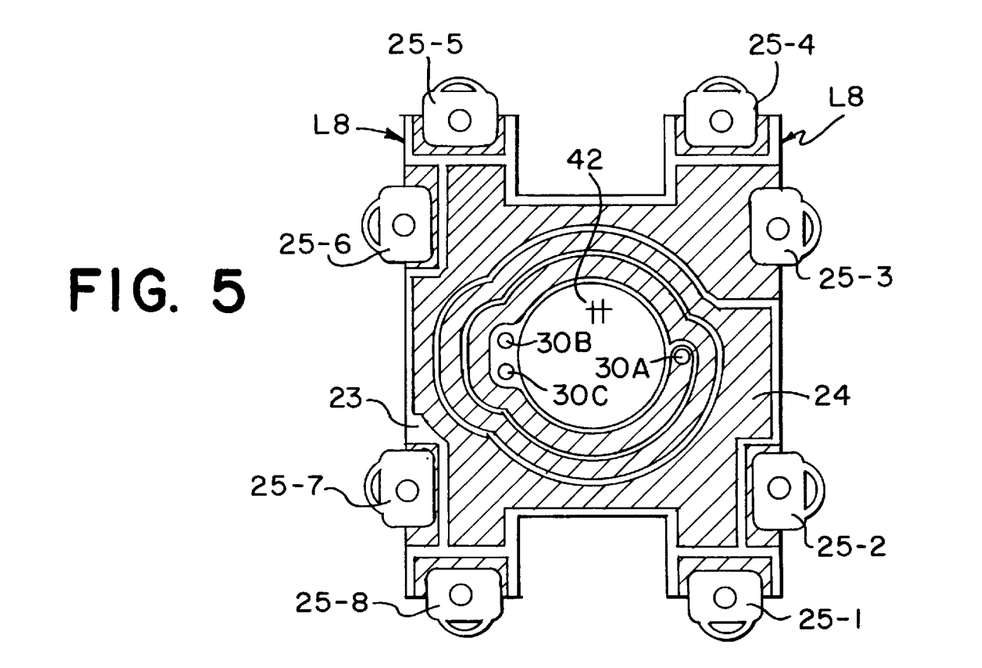
FIG. 5 illustrates a plan view of an eighth layer of a planar magnetic device according to a preferred embodiment of the invention including a three-turn coil.

The primary winding PW-6 includes an additional three-turn planar coil 24 on a layer L8. FIG. 5 illustrates layer L8 as having the coil 24 formed so as to have its outer periphery connected to a termination pad 25-3 and its central terminus connected to the via pad 30-A. The three-turn planar coil 24 of layer L8 winds radially outwardly from the via pad 30-A to the termination pad 25-3. This arrangement corresponds to the three-turn coil extending from the node A to the termination 3 of the schematic transformer of FIG. 3. To complete the primary winding PW-6, the coils 24 of layers L1 and L8 are electrically interconnected by drilling and plating a throughhole to connect via pads 30-A of these two layers, as described below.

Figure 6:
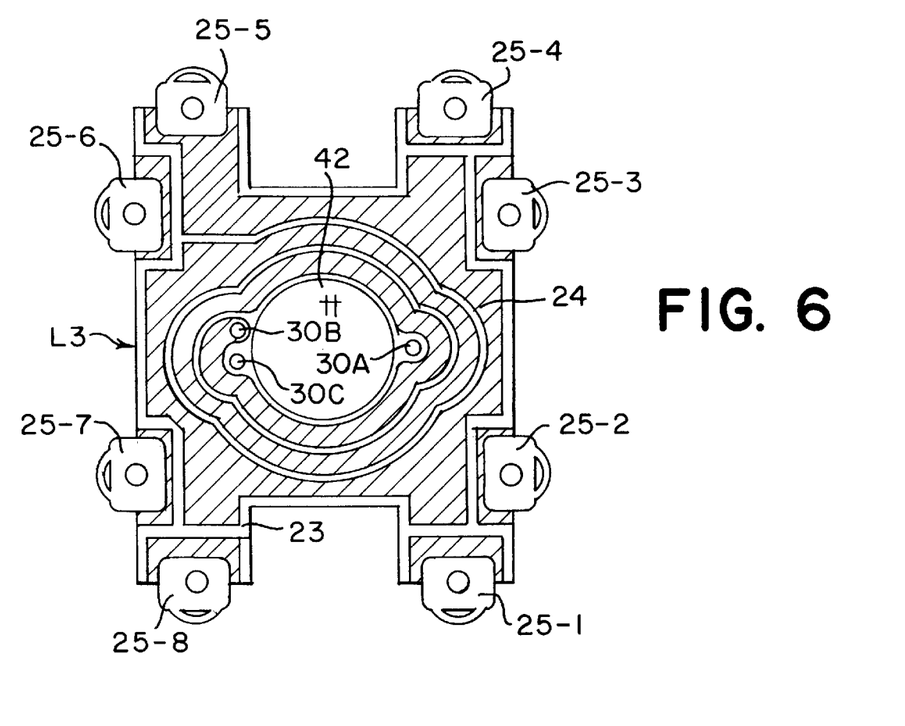
FIG. 6 illustrates a plan view of a third layer of a planar magnetic device according to a preferred embodiment of the invention including a three-turn coil.
Figure 7:
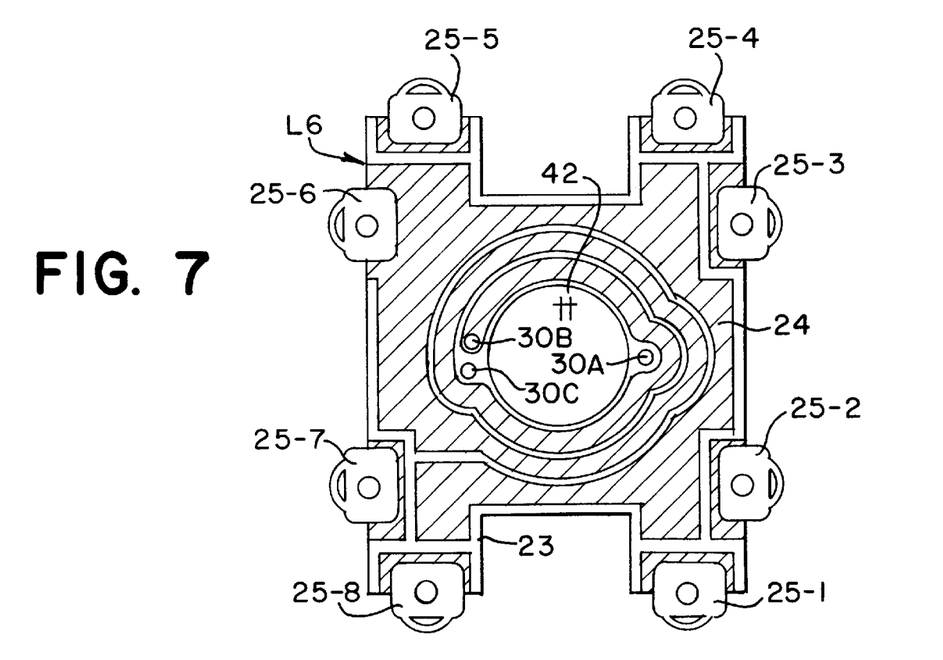
FIG. 7 illustrates a plan view of a sixth layer of a planar magnetic device according to a preferred embodiment of the invention including a two-turn coil.

Turning now to FIGS. 6 and 7, the secondary winding SW-5 comprises the interconnection of the planar coils 24 of layers L3 and L6. These coils are electrically interconnected by drilling and plating a throughhole which is aligned with via pads 30-B in the sintered body 26. FIG. 6 illustrates layer L3 having a three-turn planar coil having an outer periphery electrically connected to a termination pad 25-5 and an inner terminus electrically connected to via pad 30-B. FIG. 7 illustrates layer L6 having a two-turn planar coil having an inner terminus electrically connected to via pad 30-B and an outer periphery electrically connected to a termination pad 25-6. Upon interconnecting via pads 30-B of the layers L3 and L6, the secondary winding SW-5 results with all five turns being wound with the same sense.

Figure 8:
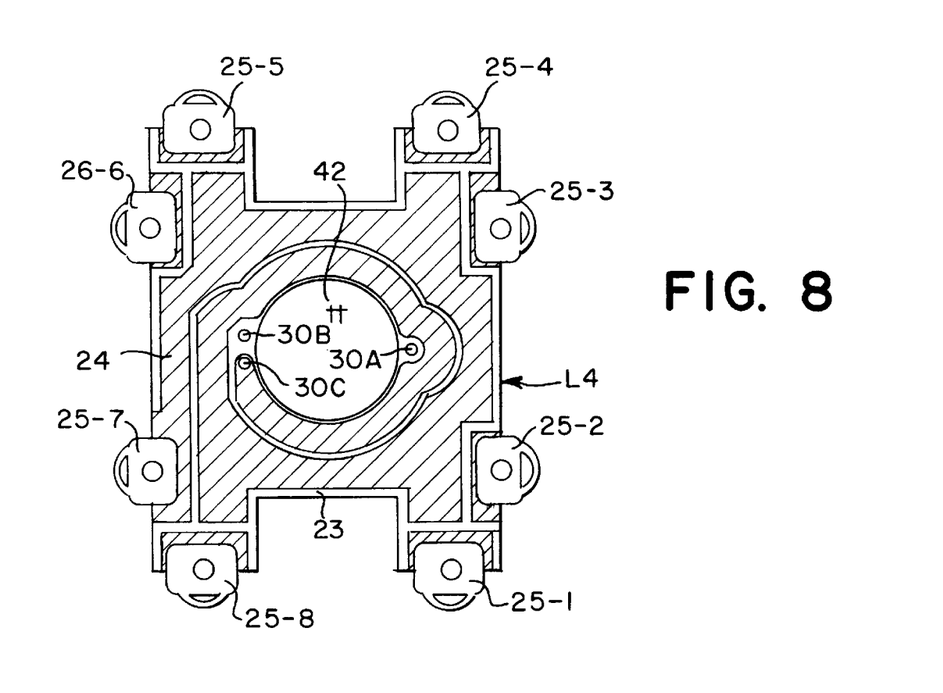
FIG. 8 illustrates a plan view of a fourth layer of a planar magnetic device according to a preferred embodiment of the invention including a two-turn coil.
Figure 9:
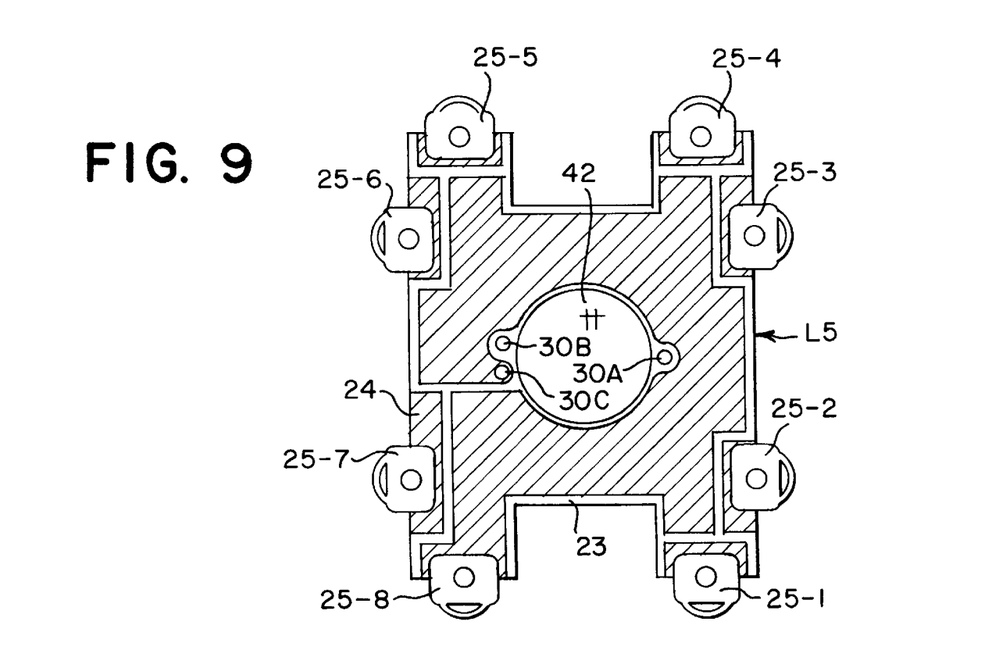
FIG. 9 illustrates a plan view of a fifth layer of a planar magnetic device according to a preferred embodiment of the invention including a single-turn coil.

From the foregoing, it can be appreciated that the three-turn secondary winding SW-3 shown schematically in FIG. 3 can be provided by interconnecting the two-turn and single-turn coils 24 of FIGS. 8 and 9, respectively, at via pads 30-C. From FIGS. 8 and 9, it can be seen that a termination pad 25-7 of a layer L4 is electrically connected to the outer periphery of a two-turn planar coil 24 which extends radially inwardly to a central terminus at via pad 30-C and that a layer L6 extends radially outwardly in the same sense for one turn to a termination pad 25-8. Thus, a three-turn planar coil extends between termination pads 25-7 and 25-8. In comparison to FIG. 3, the secondary winding SW-3 also is seen to have a total of three-turns extending between terminations 7 and 8, with node C serially connecting (or tapping) distinct coil elements.

Figure 10:
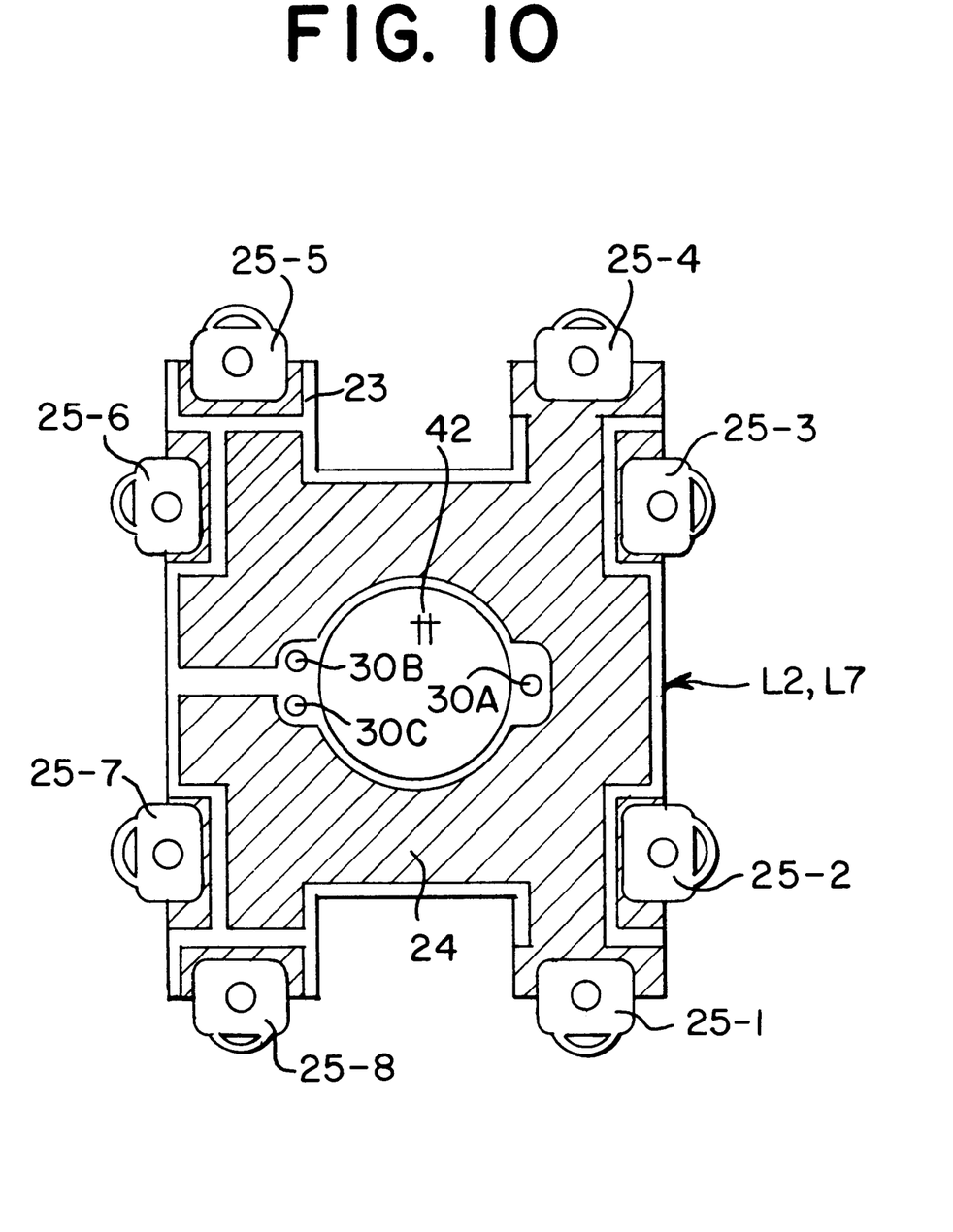
FIG. 10 illustrates a plan view of a shielding layer of a planar magnetic device according to a preferred embodiment of the invention.

Additional layers may be provided for insulation, shielding, or both to reduce noise in the transformer. For example, FIG. 10 illustrates a shielding layer which, in the preferred embodiment, comprises layers L2 and L7. The shielding layers L2 and L7 are disposed adjacent the layers L1 and L8, that is, adjacent the coils of the primary winding. When the layers L2 and L7 are electrically grounded, a return path is provided to prevent any parasitic influence on the secondary windings due to noise from the primary winding. The shielding layers L2 and L7 support a conductive trace 36 which preferably covers a substantial portion of a surface of the substrate 23, but remains clear of electrical contact with any of via pads 30 that are utilized by one of the functional layers L. The conductive trace 36 is electrically connected to at least two peripheral pads 25, and preferably to oppositely disposed peripheral pads on the substrate 23 to better ensure a balanced current flow through the shielding layer. The peripheral pads to which the conductive trace 36 is connected are preferably electrically connected to a common potential, for example, ground potential. Preferably, the conductive trace 36 has separated ends 38, 40 to provide a cove-type or generally U-shaped geometric structure.

The planar transformer 20 is formed by stacking the layers L1, L2, . . . , L8, in that order, with the layers being vertically and preferably rotationally aligned with regard to an alignment mark 42 associated with each layer. This construction has the peripheral pads 25-1, 25-2, . . . , and 25-n of one layer vertically aligned with the respective peripheral pads 25-1, 25-2, . . . , and 25-n of another layer. Those peripheral pads 25 that are not connected to a coil 24 are dummy pads, serving no purpose in the finished magnetic device whereas the peripheral pads 25 to which the coils 24 are connected define termination pad 25-x, where "x" denotes the particular pad to which the outer periphery of the coil 24 is connected (e.g., pad 25-2 on layer L1 of FIG. 4). As a result, the termination pad 25-x of one layer (L) will be offset from the termination pads 25-x' of other layers when viewed in a direction perpendicular to the coils 24. In other words, while the peripheral pads 25 line up vertically, generally, there will be only one termination pad in any vertical column (excluding the shielding layers or design constructions in which the ends of several coils are intended to be connected to the same termination pad). The magnetic device has terminations selectively plated into electrical contact with the termination pads 25-x at least along an edge or vertical margin of the sintered body 26 (e.g., the transformer 20), and preferably along a portion of the top and bottom margins. This arrangement of termination pads enables vertical plating of pin-less terminations 32 to each of the coils 24, substantially to a bottom margin of the magnetic device. This enables surface mounting of the device 20. Further, this arrangement of the termination pads 25-x results in the terminations 32 being laterally spaced from one another along a vertical edge of the monolithic assembly so that primary, secondary, and additional windings can be provided. In addition, multiple inductors can be provided in a single monolithic device, and sheilding layers can be optionally used to separate the inductors.

It should be appreciated that several of the planar coils can be formed as mirror images of each other to reduce the number of mask patterns required. For example, layers L1 and L8 may be mirror images of each other. In addition, layers L4 and L6 may be mirror images of each other provided that via pads 30-B and 30-C are suitably located on the substrate 23. As understood by those skilled in the art, the width and thickness of the generally spiral coil trace will affect its current handling capabilities, and, therefore, the maximum number of turns on any given substrate surface may be influenced by the required width of the conductive trace. As a result, additional substrates 23 may be required for a given application to support the number of turns needed, or the coils 24 may be patterned on opposite surfaces of at least some of the substrates 23 to reduce the number of required substrates to support the desired number of turns.

Also, it should be understood that more than eight peripheral pads 25 can be provided. For example, the magnetic device of FIG. 11 has thirteen peripheral pads 25, which permits up to thirteen different termination pads 25-x (25-1, . . . 25-13) to be connected to thirteen platings 32.

Figure 11:
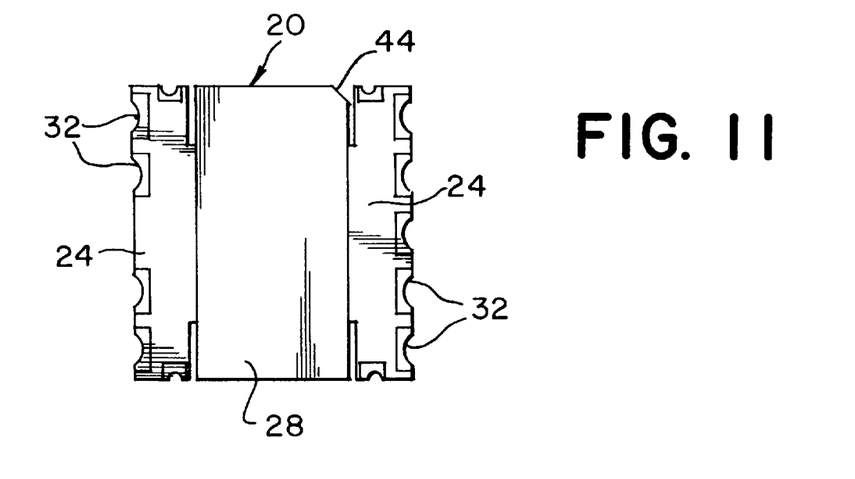
FIG. 11 illustrates a plan view of a magnetic device constructed in accordance with the invention and having thirteen terminations.
Figure 12:
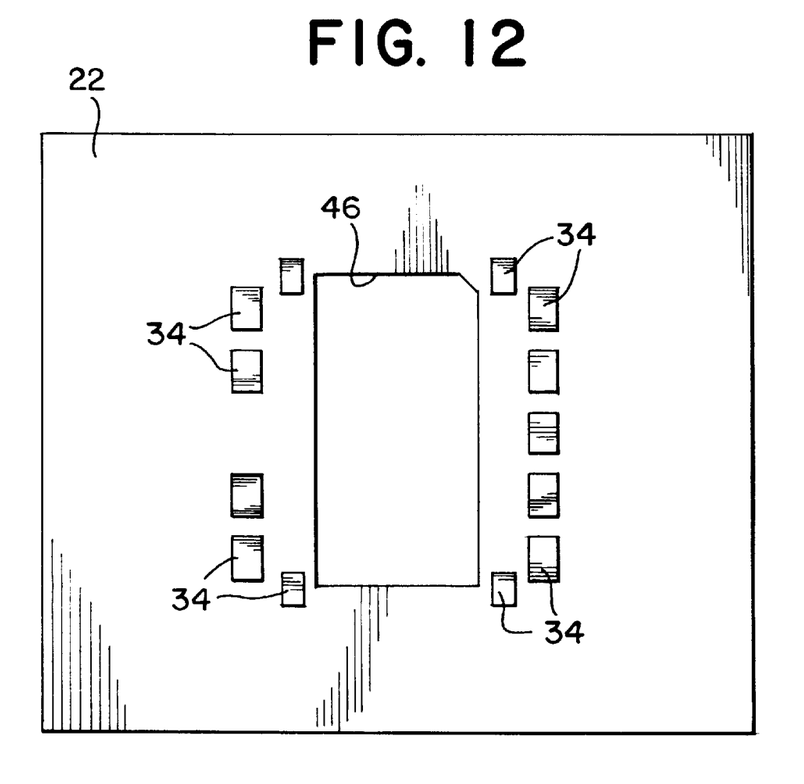
FIG. 12 illustrates a plan view of a printed circuit board having a keyed slot for receiving the magnetic device of FIG. 11.

The magnetic device may include a bevel 44 (FIG. 11) for keying its connection to the PCB 22, or for preventing improper insertion into a correspondingly keyed slot 46 in the PCB 22 (see FIG. 12).

Figure 13:
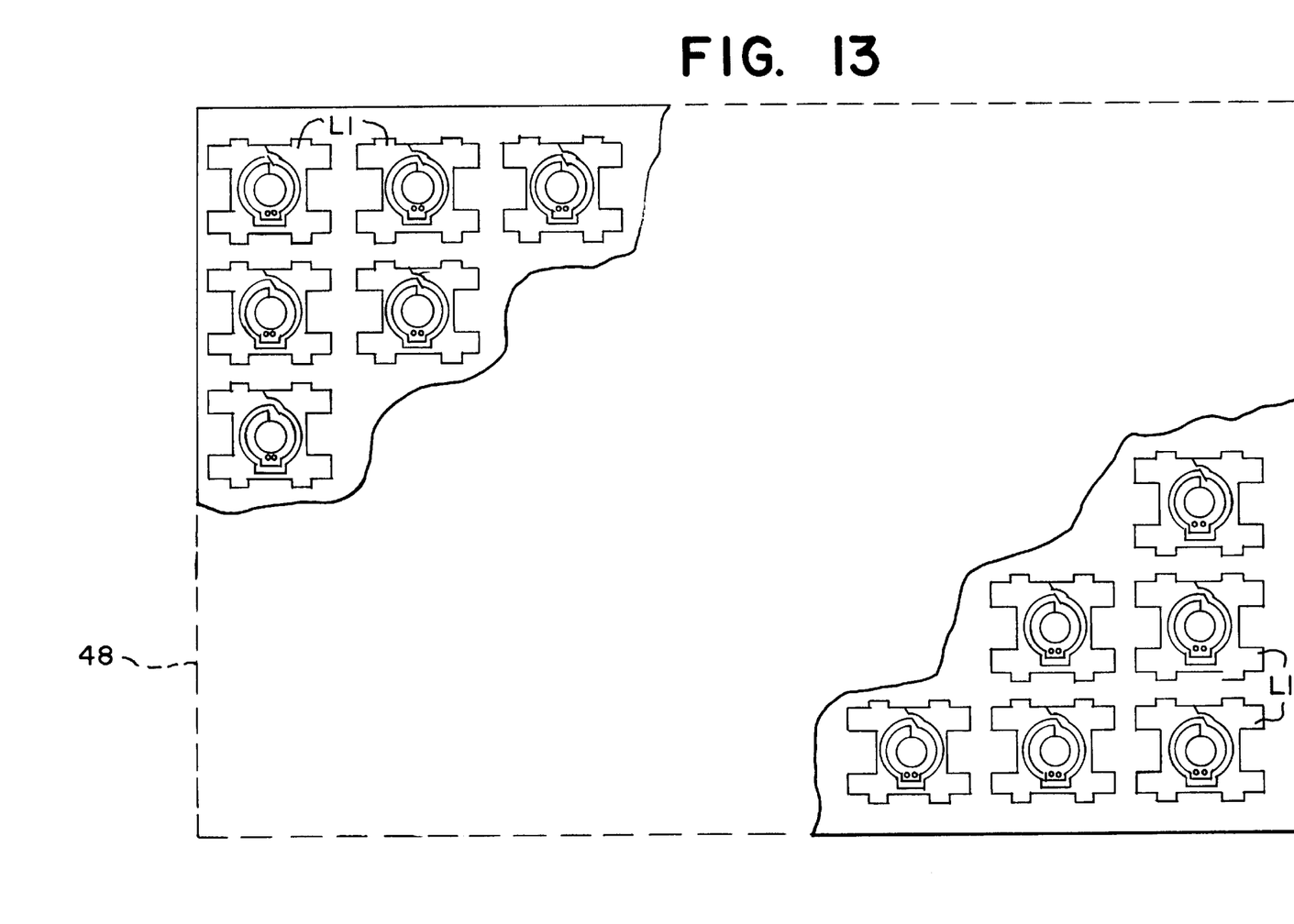
FIG. 13 illustrates a plan view of an inverse-mask pattern of the fourth layer of FIG. 8 shown in a 7×8 array of pattern repeats.

In a preferred method of manufacturing a magnetic device according to the invention, the substrates 23 are routed from a larger panel 50 having an arbitrary number of coils arranged, for example, in an array as shown in FIG. 13. FIG. 13 illustrates an array inverse-mask 48 of layer L1 of FIG. 4. The transformer 20 described above can be made using eight panels 50 formed from the same number of masks 48 (or fewer masks 48 if there is repetition of layers (e.g., layers L2 and L7) or if there is symmetry (e.g., layers L1 and L8, and layers L4 and L6) in which case the masks 48 may be rotated or flipped as understood by those skilled in the art. A plurality of panels 50 each having a given layer pattern repeated an arbitrary number of times will be used to form a magnetic device. Preferably, the panels 50 are made by photolithographic techniques well known in the art. For example, a conductive ceramic slurry can be used for the printed pattern as described in U.S. Pat. No. 3,833,872 of Marcus et al., the disclosure of which is hereby incorporated by reference as if set forth in its entirety herein.

The steps involved in the manufacture of a pin-less planar magnetic device in accordance with the present invention are now described in connection with FIG. 14.

Figure 14:
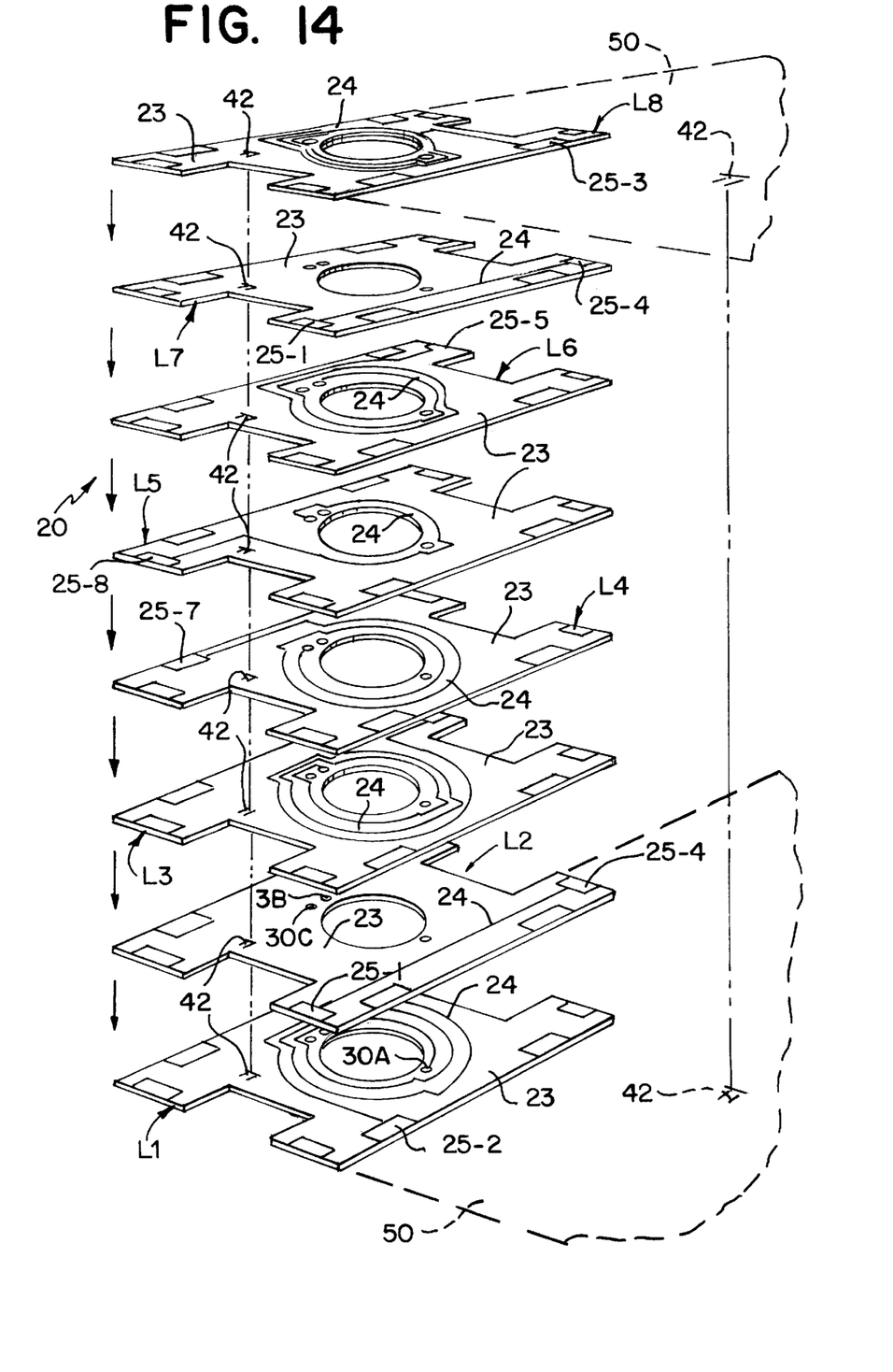
FIG. 14 illustrates an exploded perspective view of the planar magnetic device according to the preferred embodiment.

As illustrated in FIG. 14, an array of magnetic devices 20 are formed by stacking a plurality of panels 50 one on top of another. Each panel 50 includes a plurality of insulative layers or substrates 23 arranged, for example, in an array. The stacked panels 50 form an array of finished devices 20, and may include the layers generally as illustrated in detail in FIGS. 4–10, assuming that the transformer of FIG. 3 is being manufactured. However, other arrangements of layers (L) are within the scope of the invention, and additional layers may be included to improve, for example, (1) intralayer or interwinding isolation, and/or (2) structural integrity. Regardless of the design specifications of the magnetic device, at least a portion of the stacked substrates 23 will support a coil 24 having a predetermined number of turns. Each such substrate 23 will include a termination pad 25-x which is conductively connected to an outer periphery of the coil 24.

According to a preferred method of manufacture, each layer (L) is initially formed as a panel 50 having an arbitrary number conductive coils 24 repeated on a corresponding number of attached substrates 23. Each of the coils 24 has a predetermined number of turns. Preferably, the coils 24 are formed on the substrates 23 at the same time as the alignment mark 42, the peripheral pads 25, and via pads 30. The steps for forming these features are as follows. First, a sheet of conductive material is deposited onto the attached substrates 23 of the panel 50. One suitable material for the conductive material which will become the coil 24 is copper. Second, a photoresist material is applied to the deposited conductive material. Third, the photoresist material is masked with a desired layer pattern (for example, with the mask pattern 48 of FIG. 13). Fourth, the photoresist is exposed in a conventional manner (for example, using ultraviolet light). Finally, any residue resulting from this process is rinsed away. Regardless of whether a positive or negative photoresist is used, the photoresist can be etched to obtain the desired layer pattern. Once these steps have been performed, the layer is set aside for stacking with other layers, each of which has a desired layer pattern formed thereon as a result of the foregoing steps.

In FIG. 14, the alignment mark 42 is provided at preselected locations of the panel 50 such that only certain ones of the substrates 23 need include the alignment mark 42 (see also FIG. 13). The remaining substrates 23 will be vertically aligned with the other layers of the magnetic device by virtue of their attachment to the panel 50. The panels 50 are stacked with regard to the alignment markings to be vertically, and preferably rotationally, aligned with one another. Preferably, the panels 50 are seated in a mounting base having pins extending therefrom. The pins may extend through throughholes (not shown) formed in the panels 50 (or may at least partially circumscribe the panels 50) to assist in aligning the panels 50 relative to one another. The throughholes (when provided) may be formed in the panel 50 with regard to marks printed thereon, for example, the alignment marks 42.

Once each of the panels 50 is aligned and stacked, the individual substrates 23 may be laminated to form a monolithic structure, that is, the sintered body 26. In accordance with the preferred embodiment, lamination occurs by applying pressure to the stack and by heating the stack of layers. To bond adjacent layers, it is presently preferred that one or more thermally reactive insulating sheets be interposed between the panels 50 to assist in bonding the layers (L) of the individual magnetic devices 20. One suitable material known as "prepreg" is thermally reactive and will cause adjacent substrates 23 to bond into a solid, monolithic structure upon pressing and/or heating. Alternatively, the laminating step can proceed as described in the U.S. Pat. No. 3,833,872 patent of Marcus et al., which patent was previously incorporated by reference.

An additional prepreg sheet or some other type of insulating sheet can be provided to provide the required degree of insulation between the layers, the required degree of insulation being a function of the magnitude of the current flowing through the coils 24.

The sintered body 26 may comprise each of the layers (L) required to form the magnetic device. Alternatively, the sintered body 26 may comprise a subassembly of layers (L) including only preselected layers of a finished magnetic device 20. It may be desirable to create a subassembly where additional processing is required, for example, the formation and plating of "internal" vias, that is, vias which do not extend through all of the layers because they might otherwise align with other vias in the finished device. Were such vias plated after all of the required layers were sintered together, an unintended short circuit might result if the vias of one subassembly align vertically with the vias of another subassembly. Assuming that a subassembly is to be created, the subassembly is formed by providing substrates having desired layer patterns formed thereon, stacking the subassembly of layers in accordance with the alignment marking(s) 42, laminating the stacked layers by heating and compressing, and drilling and plating vias through the subassembly to selectively interconnect the inner termini of the coils of predetermined ones of the substrates 23 in the subassembly.

Once all the layers have been stacked and aligned, including any subassembly of layers, the stacked layers are laminated to form the sintered body 26, as described above. The device is then drilled at locations aligned with via pads 30 in the vertical direction (that is, in a direction perpendicular to the coils 24). If the magnetic device 20 is a transformer, an aperture 29 is routed in an area of the substrate 23 which is surrounded by the coil 24. The aperture 29 is sized to receive a ferrite core 28.

In any event, the sintered body 26 is routed along its edges to expose the termination pads 25 of each of the layers L. As a result of the routing steps, the stacked layers will appear as shown in FIGS. 4–10, although the routing step may leave the individual coils 24 of the panel 50 attached at non-critical locations by means of a tab or similar structure so that the individual magnetic devices can have their respective terminations (platings) formed at the same time. Preferably, the router routes a slot in the edge of the sintered body 26 within the termination pads 25-x for the platings 32 (see FIG. 2). The slot tends to trap solder and increases the electrical contact area and mechanical strength of the termination formed by the plating 32. In addition, the slot increases the effective width of the termination which improves the ability of the device to dissipate heat.

The drilled and routed sintered body 26 is then covered with a plating mask along surfaces that are both parallel and perpendicular to the plane of the coils 24, and then submerged within a conventional plating bath (optionally after applying a conventional paste to promote adhesion of the material to be plated) according to techniques well-known in the art. (The plating bath and paste form no part of the present invention.) As understood by those skilled in the art, one end of each of the routed via apertures is connected to an electrical potential to cause the plating material to precipitate within via and thereby electrically interconnect the inner termini of coils 24 of at least two different layers L. The step of plating vias causes the central termini of pairs of coils 24 to be electrically interconnected. The particular pairs of coils which will be electrically interconnected by the plating step are those drill holes that are aligned in the direction perpendicular to the coils 24. These coils are have their central termini offset from the central termini of other coils 24. The coils 24 having vertically aligned central termini may be supported on opposite sides of the same substrate, or on different substrates 23. For example, the coil pairs of FIGS. 4 and 5 have their central termini aligned with via pad 30-A, the coil pairs of FIGS. 6 and 7 have their central termini aligned with via pad 30-B, and the coil pairs of FIGS. 8 and 9 have their central termini aligned with via pad 30-C.

In addition, an electrical potential is attached along either the bottom or top margin of the sintered body 26 to enable plating along a vertical edge of the sintered body at predetermined locations therealong. The edge locations at which the sintered body 26 is plated align with the termination pads 25-x. As a result, the termination pads 25-x extend in a vertical direction substantially to a bottom margin of the sintered body 26 thereby resulting in a pin-less termination of the magnetic device 20. Preferably, the plating extends onto at least a bottom margin of the sintered body 26 to permit direct seating of the terminations 32 onto the contact pads 34 of the PCB 22. The plated terminations 32 preferably overlap at least the bottom surface of the magnetic device 20 to ensure a more reliable connection upon surface mounting on the PCB 22.

To complete the transformer of FIG. 3, a magnetically permeable core 28 is disposed within the aperture 29 (FIG. 1). Of course, if the magnetic device is to be an inductor, the steps of routing an aperture sized to receive a magnetically permeable core and of providing a magnetically permeable core would be omitted.

The conductive coils 24 can be provided on more than one surface of the substrate 23. In this case, the step of stacking the plurality of substrate layers further includes the step of providing insulative layers therebetween so that the coils of adjacent layers do not short circuit each other. In the preferred embodiment, the aforementioned "prepreg" sheets are used to space the layers L.

The planar magnetic device 20 so formed is connected to the PCB 22 by directly connecting the terminations or platings 32 to the contact pads 34 on the PCB 22. This may be by a reflow, wave, or manual soldering technique. The platings 32 are connected to the termination pads 25-x of a specific layer by direct contact therewith as a result of the routing step. The invention contemplates platings or terminations 32, termination pads 25-x, and coils 24 of various shapes, configurations, and dimensions.

As perhaps best appreciated from FIGS. 11 and 12, the correct orientation of the magnetic device 20 can be better ensured if one of the corners is bevelled as shown at 44. Once inserted within a cutout 46 of the PCB 22, the walls of the cutout 46 will hold the transformer in place with only limited displacement due to the small spacing tolerances between the core and the PCB cutout. The contact pads 34 are sufficiently large to offset placement tolerances of conventional component insertion machines.

The pin-less terminations 32 provide several advantages over conventional connections. First, they permit a direct connection of the termination pads 25-x and thereby improve the reliability of the magnetic device. Second, the platings 32 have reduced termination resistance as compared to pin-terminations which is especially important with regard to applications which require high-current. Third, because the PCB 22 and the planar coils 24 can be made from the same material (e.g., copper), they can be made to have the same thermal expansion characteristics and thereby improve thermal cycling capability of the magnetic device. Fourth, improved thermal characteristics result because the copper-to-copper contact area between the contact pads 34 of the PCB 22 and the termination pads 25-x of the planar coils 24 is larger than possible using pins, and, therefore, more heat is removed from the magnetic device—a particular advantage where the magnetic device is a transformer for use in a power supply circuit.

Concomitant advantages include the simplification of the assembly process. In particular, an additional element to secure the magnetic device 20 to the PCB 22 is not required. Nor is pin insertion or pin mounting equipment required. Further, packaging and shipping of a magnetic device according to the invention is simplified because there is no need to protect any pins from damage or bending. Finally, there is an improved mechanical connection by the use of platings instead of pins with their greater surface area, especially in combination with the lowered center of gravity of the transformer when inserted into a slot 46 of the PCB 22. The provision of additional "dummy" pads not connected to any particular winding during the final plating step can further improve the mechanical strength of the assembly.

Generally speaking the minimum number of vias required by the magnetic device assembly according to the invention (in which a termination pad is available at an edge of the substrate 23) is related to the number of planar surfaces required to support a particular winding times the number of windings in the device, and can be expressed as the sum of (n−1) for each of the windings in the magnetic device, where "n" is the number of planar surfaces. For example, in the transformer of FIGS. 4–9, each of the primary and two secondary windings is constructed on two planar substrates 23, and so a total of three vias are required. If a large number of turns are required for a particular winding, then additional planar surfaces may be required to complete the winding along with additional vias.

While the invention has been particularly shown and described with reference to a preferred embodiment thereof, it will be understood by those skilled in the art that various changes in form and details may be made therein without departing from the spirit and scope of the invention.

I claim:

1. A method of manufacturing a pin-less, surface mountable planar transformer, comprising the steps of:
   a. providing a plurality of insulative layers each having a predetermined number of conductive coil turns, a termination pad conductively connected to, each of said conductive coil turns and an alignment marking supported on a surface thereof;
   b. stacking the plurality of insulative layers;
   c. aligning the stacked layers using the alignment markings;
   d. laminating the stacked layers to form a monolithic structure;
   e. drilling vias through the monolithic structure;
   f. routing an aperture in the monolithic structure sized to receive a magnetically permeable core, and routing a portion of an edge of the monolithic structure to expose the termination pad of at least one of the plurality of insulative layers;
   g. masking the routed monolithic structure;
   h. plating the vias to selectively interconnect each of said conductive coil turns of predetermined ones of said plurality of insulative layers and to form pin-less terminations at the exposed termination pads; and
   i. providing a magnetically permeable core within each of said apertures.

2. The method as in claim 1, wherein at least one of the plurality of insulative layers includes coil turns supported on a second surface thereof, the step of stacking the plurality of layers further comprising the step of providing insulative layers therebetween.

3. The method as in claim 1, wherein the predetermined number of conductive coil turns of each of said plurality of insulative layers and said termination pad are formed by:
   applying photoresist to the conductive material;
   masking the photoresist with a desired layer pattern;
   exposing at least a portion of the photoresist;
   etching the photoresist to obtain the desired layer pattern; and
   rinsing the layer clean of residue.

4. The method as in claim 1, wherein the step of laminating is achieved by compressing and heating the layers.

5. The method as in claim 1, wherein each of said plurality of insulative layers includes an arbitrary number of pattern repeats of the coil turns, termination pad, and alignment marking, the pattern repeats being arranged in an X by Y array, and wherein the step of routing includes the step of separating the monolithic structure into individual transformers.

6. A method of manufacturing a pin-less, surface mountable planar transformer from at least one subassembly, comprising the steps of:
   forming at least one subassembly by:
      a. providing a plurality of insulative layers each having a predetermined number of conductive coil turns, a termination pad conductively connected to each of said conductive coil turns, and an alignment marking supported on a surface thereof;
      b. stacking the plurality of insulative layers;
      c. aligning the stacked layers using the alignment markings;
      d. laminating the stacked layers to form a monolithic subassembly structure;
      e. drilling vias through the monolithic subassembly structure; and
      f. plating the vias to selectively interconnect each of said conductive coil turns of predetermined ones of said plurality of insulative layers of said monolithic subassembly structure;
   stacking the subassembly with at least one of another subassembly and an insulative layer to form a stacked assembly, the insulative layer including a predetermined number of conductive coil turns, a termination pad conductively connected to each of said conductive coil turns, and an alignment marking supported on a surface thereof;
   aligning the stacked assembly using the alignment markings;
   laminating the stacked assembly to form a monolithic assembly;
   drilling vias through the monolithic assembly;
   routing an aperture in the monolithic assembly sized to receive a ferrite core, and routing a portion of an edge of the monolithic assembly to expose the termination pad of at least one of the plurality of insulative layers;
   masking the routed monolithic structure;
   plating the vias to selectively interconnect each of said conductive coil turns of predetermined ones of said plurality of insulative layers of the monolithic assembly and to form pin-less terminations at the exposed termination pads; and
   providing a magnetically permeable core within the aperture.

7. The method as in claim 6, wherein at least one of the plurality of insulative layers includes coil turns supported on a second surface thereof, the step of stacking the plurality of layers further comprising the step of providing insulative layers therebetween.

8. The method as in claim 6, wherein the predetermined number of conductive coil turns of each of said plurality of insulative layers and said termination pad are formed by:
   applying photoresist to the conductive material;
   masking the photoresist with a desired layer pattern;
   exposing at least a portion of the photoresist;
   etching the photoresist to obtain the desired layer pattern; and
   rinsing the layer clean of residue.

9. The method as in claim 6, wherein the step of laminating is achieved by compressing and heating the layers.

10. The method as in claim 6, wherein each of said plurality of insulative layers includes an arbitrary number of pattern repeats of the coil turns, termination pad, and alignment marking, the pattern repeats being arranged in an X by Y array, and wherein the step of routing includes the step of separating the monolithic structure into individual transformers.

11. A method of manufacturing a pin-less, surface mountable planar magnetic device, comprising the steps of:

a. providing a plurality of insulative layers each having a predetermined number of conductive coil turns, a termination pad conductively connected to each of said conductive coil turns, and an alignment marking supported on a surface thereof, the coil turns and termination pad being formed by applying photoresist to the conductive material, masking the photoresist with a desired layer pattern, exposing at least a portion of the photoresist, etching the photoresist to obtain the desired layer pattern, and rinsing the layer clean of residue;

b. stacking the plurality of insulative layers;

c. aligning the stacked layers using the alignment markings;

d. laminating the stacked layers to form a monolithic structure;

e. drilling vias through the monolithic structure;

f. routing an aperture in the monolithic structure sized to receive a ferrite core, and routing a portion of an edge of the monolithic structure to expose the termination pad of at least one of the plurality of insulative layers;

g. masking the routed monolithic structure; and h. plating the vias to selectively interconnect each of said conductive coil turns of predetermined ones of said plurality of insulative layers and to form pin-less terminations at the exposed termination pads.

12. The method as in claim 11, wherein at least one of the plurality of insulative layers includes coil turns supported on a second surface thereof, the step of stacking the plurality of layers further comprising the step of providing insulative layers therebetween.

13. The method as in claim 11, wherein the step of laminating is achieved by compressing and heating the layers.

14. The method as in claim 11, wherein each of said plurality of insulative layers includes an arbitrary number of pattern repeats of the coil turns, termination pad, and alignment marking, the pattern repeats being arranged in an X by Y array, and wherein the step of routing includes the step of separating the monolithic structure into individual magnetic devices.

15. A method of manufacturing a pin-less, surface mountable planar magnetic device, comprising the steps of:

a. providing at least one insulative substrate having conductive material on at least one side thereof and an alignment marking;

b. applying photoresist to the conductive material;

c. masking the photoresist with a desired layer pattern, the desired layer pattern including a predetermined number of conductive coil turns and a termination pad conductively connected to each of said conductive coil turns;

d. exposing the photoresist;

e. etching the photoresist to obtain the desired layer pattern on the insulative substrate;

f. rinsing the etched layer pattern clean of residue;

g. repeating steps a–f for each desired layer pattern in order to obtain a series of desired layer patterns for stacking;

h. stacking the plurality of insulative layers;

i. aligning the stacked layers using the alignment markings;

j. laminating the stacked layers to form a monolithic structure;

k. drilling vias through the monolithic structure;

l. routing an aperture in the monolithic structure sized to receive a ferrite core, and routing a portion of an edge of the monolithic structure to expose the termination pad of at least one of the plurality of insulative layers;

m. masking the routed monolithic structure; and n. plating the vias to selectively interconnect each of said conductive coil turns of predetermined ones of said plurality of insulative layers and to form pin-less terminations at the exposed termination pads.

16. The method as in claim 15, wherein at least one of the plurality of insulative layers includes coil turns supported on a second surface thereof, the step of stacking the plurality of layers further comprising the step of providing insulative layers therebetween.

17. The method as in claim 15, wherein the step of laminating is achieved by compressing and heating the layers.

18. The method as in claim 15, wherein each of said plurality of insulative layers includes an arbitrary number of pattern repeats of the coil turns, termination pad, and alignment marking, the pattern repeats being arranged in an X by Y array, and wherein the step of routing includes the step of separating the monolithic structure into individual magnetic devices.

19. A method of manufacturing a pin-less, surface mountable planar transformer, comprising the steps of:

a. providing a plurality of insulative layers each having a predetermined number of conductive coil turns, a termination pad conductively connected to each of said conductive coil turns and an alignment marking supported on a surface thereof;

b. drilling vias through each of the insulative layers;

c. routing an aperture in each of the insulative layers sized to receive a magnetically permeable core, and routing a portion of an edge of the each of the insulative layers to expose the termination pad of each of the insulative layers;

d. stacking the plurality of insulative layers;

e. aligning the stacked layers using the alignment markings;

f. laminating the stacked layers to form a monolithic structure;

g. masking the routed insulative layers;

h. plating the vias to selectively interconnect each of said conductive coil turns of predetermined ones of said plurality of insulative layers and to form pin-less terminations at the exposed termination pads; and i. providing a magnetically permeable core within each of said apertures.

20. The method as in claim 19, wherein at least one of the plurality of insulative layers includes coil turns supported on a second surface thereof, the step of stacking the plurality of layers further comprising the step of providing insulative layers therebetween.

* * * * *